United States Patent
Zhao et al.

(10) Patent No.: US 10,171,199 B2
(45) Date of Patent: Jan. 1, 2019

(54) TUNABLE LASER IN AN OPTICAL ACCESS NETWORK

(71) Applicant: Google Inc., Mountain View, CA (US)

(72) Inventors: Xiangjun Zhao, Fremont, CA (US); Daoyi Wang, San Jose, CA (US); Liang Du, Santa Clara, CA (US); Changhong Joy Jiang, Dublin, CA (US); Cedric Fung Lam, San Carlos, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 15/385,798

(22) Filed: Dec. 20, 2016

(65) Prior Publication Data

US 2018/0175964 A1    Jun. 21, 2018

(51) Int. Cl.
| | |
|---|---|
| *H04B 10/27* | (2013.01) |
| *H04J 14/02* | (2006.01) |
| *H04Q 11/00* | (2006.01) |
| *H04B 10/572* | (2013.01) |
| *H01S 5/0625* | (2006.01) |

(52) U.S. Cl.
CPC ......... *H04J 14/0242* (2013.01); *H04B 10/27* (2013.01); *H04B 10/572* (2013.01); *H04Q 11/0066* (2013.01); *H04Q 11/0067* (2013.01); *H01S 5/06256* (2013.01); *H04Q 2011/0018* (2013.01)

(58) Field of Classification Search
CPC combination set(s) only.
See application file for complete search history.

(56) References Cited

U.S. PATENT DOCUMENTS

| | | |
|---|---|---|
| 8,023,824 B2 | 9/2011 | Yu et al. |
| 8,744,265 B2 | 6/2014 | Effenberger |
| 9,455,782 B2 | 9/2016 | Zheng et al. |

(Continued)

OTHER PUBLICATIONS

W. Poehlmann, D. van Veen, R. Farah, T. Pfeiffer, and P. Vetter, "Wavelength Drift of Burst-mode DML for TWDM-PON," IEEE Journal of Optical Communications and Networking, vol. 7, No. 1, pp. 4451, Jan. 2015.

(Continued)

*Primary Examiner* — David C Payne
*Assistant Examiner* — Omar S Ismail
(74) *Attorney, Agent, or Firm* — Honigman Miller Schwartz and Cohn LLP

(57) ABSTRACT

A system includes a multiplexer having a pass-band and an optical network unit (ONU) optically coupled to the multiplexer. The ONU includes a tunable laser configured to continuously transmit an optical signal to the multiplexer in a burst-on state and a burst-off state. While in the burst-on state, the ONU is configured to tune the tunable laser to transmit the optical signal at a transmit wavelength within the wavelength pass-band of the multiplexer. The multiplexer configured to allow passage therethrough of the optical signal at the transmit wavelength. While in the burst-off state, the ONU is configured to tune the tunable laser to transmit the optical signal at a non-transmit wavelength outside of the wavelength pass-band of the multiplexer. The multiplexer configured to block passage therethrough of the optical signal at the non-transmit wavelength.

20 Claims, 5 Drawing Sheets

(56) References Cited

U.S. PATENT DOCUMENTS

| | | | |
|---|---|---|---|
| 2006/0127093 A1* | 6/2006 | Park | H04J 14/0226 398/226 |
| 2008/0019697 A1* | 1/2008 | Sala | H04B 10/272 398/99 |
| 2011/0211834 A1* | 9/2011 | Ansari | H04J 14/0282 398/58 |
| 2013/0016972 A1* | 1/2013 | Zheng | H04J 14/02 398/71 |
| 2013/0016977 A1* | 1/2013 | Zheng | H01S 5/0268 398/87 |
| 2015/0063812 A1* | 3/2015 | Dove | H04B 10/40 398/67 |
| 2015/0104179 A1* | 4/2015 | Wang | H04B 10/564 398/81 |
| 2015/0357791 A1* | 12/2015 | Zheng | H01S 5/1215 398/69 |
| 2016/0043799 A1 | 2/2016 | Zheng et al. | |

OTHER PUBLICATIONS

Bonk R et al: "The underestimated challenges of burst-mode WDM transmission in TWDM-PON" vol. 26, pp. 59-70, Jul. 16, 2015.
International Search Report and Written Opinion for the related PCT Application No. PCT/US2017/053368 dated Nov. 30, 2017.

* cited by examiner

TUNABLE LASER IN AN OPTICAL ACCESS NETWORK

TECHNICAL FIELD

This disclosure relates to a tunable laser in an optical access network.

BACKGROUND

Fiber optic communication is an emerging method of transmitting information from a source (transmitter) to a destination (receiver) using optical fibers as the communication channel. WDM-PON is an optical technology for access and backhaul networks. WDM-PON uses multiple different wavelengths over a physical point-to-multipoint fiber infrastructure that contains passive optical components. The use of different wavelengths allows for traffic separation within the same physical fiber. The result is a network that provides logical point-to-point connections over a physical point-to-multipoint network topology. WDM-PON allows operators to deliver high bandwidth to multiple endpoints over long distances. A PON generally includes an optical line terminal located at a service provider central office (e.g., a hub), a remote node connected to the central office by a feeder fiber, and a number of optical network units or optical network terminals, near end users. The remote node demultiplexes an optical signal from the central office and distributes the demultiplexed optical signals to multiple optical network terminals along corresponding distribution fibers. Time-division-multiplexing (TDM) is a method of transmitting and receiving independent signals over a common signal path by using different, non-overlapping time slots. Time wavelength division multiplexing (TWDM) uses both time and wavelength dimensions to multiplex signals.

SUMMARY

One aspect of the disclosure provides a system for continuously transmitting communications from an optical network unit (ONU) to a multiplexer. The system includes the multiplexer having a wavelength pass-band and the ONU optically coupled to the multiplexer. The ONU includes a tunable laser configured to continuously transmit an optical signal to the multiplexer in a burst-on state and a burst-off state. The ONU is configured to perform operations including, while in the burst-on state, tuning the tunable laser to transmit the optical signal at a transmit wavelength within the wavelength pass-band of the multiplexer. The multiplexer is configured to allow passage therethrough of the optical signal at the transmit wavelength. While in the burst-off state, the ONU is configured to tune the tunable laser to transmit the optical signal at a non-transmit wavelength outside of the wavelength pass-band of the multiplexer. The multiplexer is configured to block passage therethrough of the optical signal at the non-transmit wavelength.

Implementations of the disclosure may include one or more of the following optional features. In some implementations, the tunable laser includes a distributed Bragg reflector (DBR) laser configured to receive a wavelength tuning injection current. The wavelength tuning injection current biases the wavelength of the optical signal.

In some implementations, the operations include altering the wavelength of the optical signal between the transmit wavelength and the non-transmit wavelength by altering the wavelength tuning injection current to the tunable laser. The operations may also include: receiving a request to transmit a data packet on the optical signal: triggering the burst-on state; transmitting the data packet on the optical signal while in the burst-on state; and triggering the burst-off state.

In some examples, the multiplexer includes an arrayed wavelength grating. The system may also include an optical line terminal (OLT) optically coupled to the arrayed wavelength grating. The system may further include a plurality of ONUs optically coupled to the arrayed wavelength grating, wherein the arrayed wavelength grating has a multiplex port optically coupled to the OLT and a plurality of demultiplex ports. Each demultiplex port may be associated with a corresponding wavelength pass-band and optically coupled to a corresponding ONU of the plurality of ONUs. The arrayed wavelength grating may be disposed at the OLT. The multiplexer may be disposed at a remote node optically coupled to the ONU.

Another aspect of the disclosure provides a system for continuously transmitting communications from an optical network unit (ONU) to a multiplexer. The system includes the multiplexer having a wavelength pass-band, a tunable laser optically coupled to the multiplexer, and a controller electrically coupled to the tunable laser. The tunable laser may be located at the ONU. The tunable laser is configured to continuously transmit an optical signal to the multiplexer in a burst-on state or a burst-off state. The controller is configured to perform operations including receiving a request to transmit a data packet and triggering the burst-on state of the tunable laser by transmitting a burst-on current to the tunable laser. The burst-on current biases the tunable laser to transmit the optical signal at a transmit wavelength within the wavelength pass-band of the multiplexer. The multiplexer is configured to allow passage therethrough of the optical signal at the transmit wavelength. The operations also include instructing the tunable laser to transmit the data packet in the optical signal while the tunable laser is in the burst-on state and triggering the burst-off state of the tunable laser by transmitting a burst-off current to the tunable laser. The burst-off current biases the tunable laser to transmit the optical signal at a non-transmit wavelength outside of the wavelength pass-band of the multiplexer. The multiplexer is configured to block passage therethrough of the optical signal at the non-transmit wavelength.

This aspect may include one or more of the following optional features. In some implementations, the tunable laser includes a distributed Bragg reflector (DBR) laser. The multiplexer may include an arrayed wavelength grating. The system may further include an optical line terminal (OLT) optically coupled to the arrayed wavelength grating. The arrayed wavelength grating may be disposed at the OLT. The multiplexer may be disposed at a remote node optically coupled to the tunable laser.

Yet another aspect of the disclosure provides a method for enabling a burst-off state of a tunable laser. The method includes receiving, at data processing hardware, a request to transmit a data packet from an optical network unit (ONU) to an optical line terminal (OLT) of an optical access network having a multiplexer optically coupled between the ONU and the OLT. The multiplexer has a wavelength pass-band and the ONU includes the tunable laser configured to continuously transmit an optical signal in either a burst-on state or the burst-off state. The method also includes triggering, by the data processing hardware, the burst-on state of the tunable laser by transmitting a burst-on current to the tunable laser. The burst-on current biases the tunable laser to transmit the optical signal at a transmit wavelength within the wavelength pass-band of the multiplexer. The multiplexer is configured to allow passage therethrough of the optical signal at the transmit wavelength. The method further includes instructing, by the data processing hardware, the tunable laser to transmit the data packet in the optical signal and after transmission of the data packet, enabling, by the data processing hardware, the burst-off state of the tunable laser by transmitting a burst-off current to the tunable laser. The burst-off current biases the tunable laser to transmit the optical signal at a non-transmit wavelength outside of the wavelength pass-band of the multiplexer. The multiplexer is configured to block passage therethrough of the optical signal at the non-transmit wavelength.

This aspect may include one or more of the following optional features. In some implementations, the tunable laser includes a distributed Bragg reflector (DBR) laser. The multiplexer may include an arrayed wavelength grating. The arrayed grating may be disposed at the OLT. The multiplexer may be disposed at a remote node optically coupled between the ONU and the OLT.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
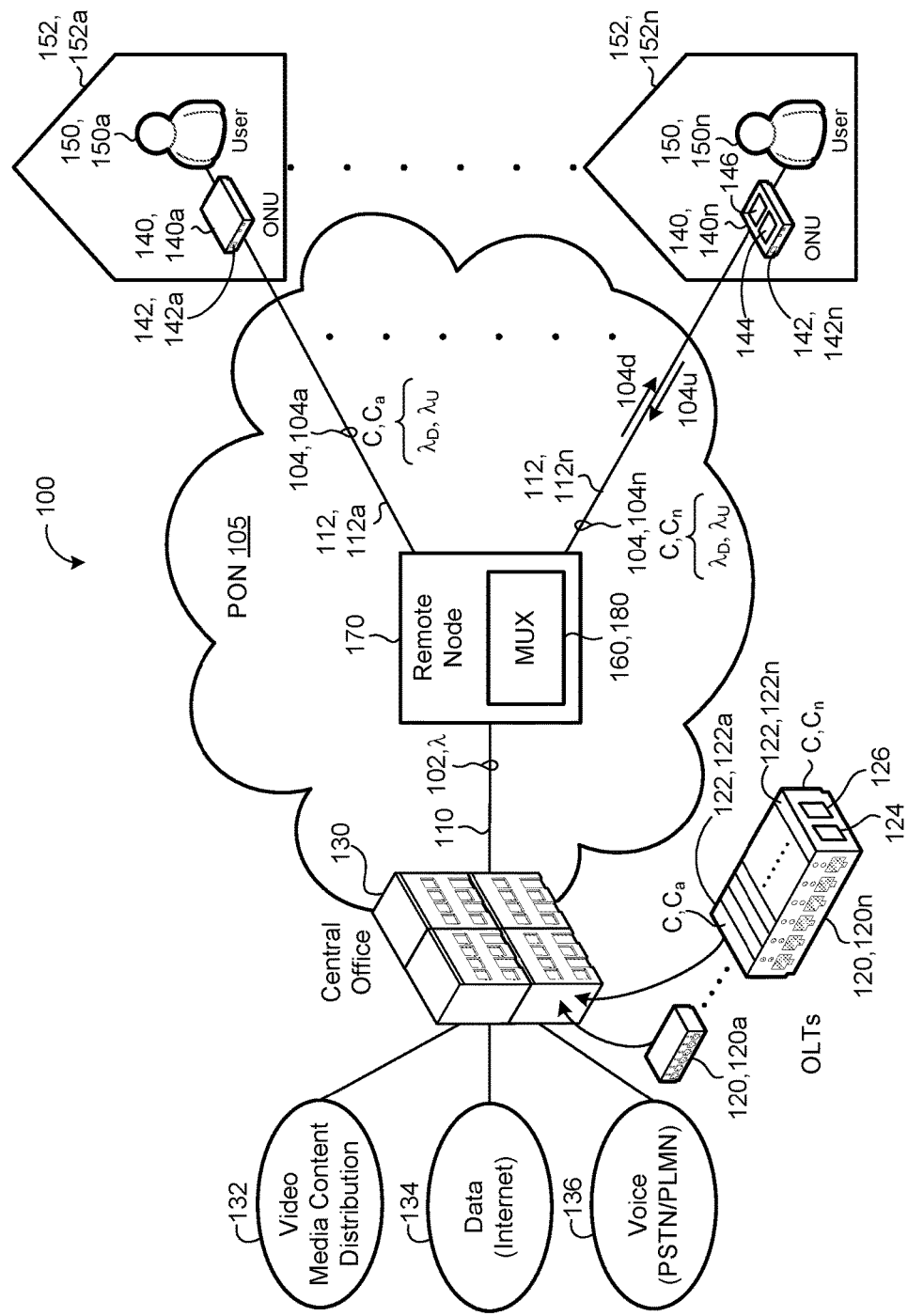
FIG. 1 is a schematic view of an example communication system.

Referring to FIG. 1, a communication system 100 delivers communication signals 102 (e.g., optical signals) through communication links 110, 112, 112a-n (e.g., optical fibers or line-of-sight free space optical communications) between an optical line terminal (OLT) 120 housed in a central office (CO) 130 and optical network units (ONUs) 140, 140a-n (e.g., a bidirectional optical transceiver) associated with users 150, 150a-n (also referred to as customers or subscribers). The ONUs 140, 140a-n are typically located at premises 152, 152a-n of the users 150, 150a-n.

Customer premises equipment (CPE) is any terminal and associated equipment located at the premises 152 of the user 150 and connected to a carrier telecommunication channel C at a demarcation point ("demarc"). In the examples shown, the ONU 140 is a CPE. The demarc is a point established in a house, building, or complex to separate customer equipment from service provider equipment. CPE generally refers to devices such as telephones, routers, switches, residential gateways (RG), set-top boxes, fixed mobile convergence products, home networking adapters, or Internet access gateways that enable the user 150 to access services of a communications service provider and distribute them around the premises 152 of the user 150 via a local area network (LAN).

In some implementations, the optical communication system 100 implements an optical access network 105, such as a passive optical network (PON) 105, for example, for access and mobile fronthaul/backhaul networks. In some examples, the optical communication system 100 implements a point-to-point (pt-2-pt) PON having direct connections, such as optical Ethernets, where a home-run optical link 110, 112 (e.g., fiber) extends all the way back to an OLT 120 at the CO 130 and each customer 150, 150a-n is terminated by a separate OLT 120a-n. In other examples, the optical communication system 100 implements a point-to-multi-point (pt-2-multi-pt) PON, where a shared OLT 120 services multiple customers 150, 150a-n.

The CO 130 includes at least one OLT 120 connecting the optical access network 105 to an Internet Protocol (IP), Asynchronous Transfer Mode (ATM), or Synchronous Optical Networking (SONET) backbone, for example. Therefore, each OLT 120 is an endpoint of the PON 105 and converts between electrical signals used by service provider equipment and optical signals 102 used by the PON 105. Each OLT 120, 120a-n includes at least one transceiver 122, 122a-n, depending on the implementation of the optical access network 105. The OLT 120 sends the optical signal 102 via a corresponding transceiver 122, through a feeder fiber 110 to a remote node (RN) 170, which includes a multiplexer 160 configured to demultiplex the optical signal 102 and distribute demulitplexed optical signals 104 to multiple users 150, 150a-n along corresponding distribution fibers 112, 112a-n. The multiplexer 160 for multiplexing/demultiplexing may be an arrayed wavelength grating 180 (AWG), which is a passive optical device. In some examples, each CO 130 includes multiple OLTs 120, 120a-n, and each OLT 120 is configured to service a group of users 150. In addition, each OLT 120 may be configured to provide signals in different services, e.g., one OLT 120 may provide services in 1G-PON, while another OLT 120 provides services in 10G-PON.

As shown in FIG. 1, the CO 130 multiplexes signals received from several sources, such as a video media distribution source 132, an Internet data source 134, and a voice data source 136, and multiplexes the received signals into one multiplexed signal 102 before sending the multiplexed optical signal 102 to the RN 170 through the feeder fiber 110. The multiplexing may be performed by the OLT 120 or a broadband network gateway (BNG) positioned at the CO 130. Typically, services are time-division-multiplexed on the packet layer.

Time-division-multiplexing (TDM) is a method of transmitting and receiving independent signals over a common signal path by using different, non-overlapping time slots. Wavelength division multiplexing (WDM) uses multiple wavelengths λ to implement point-to-multi-point communications in the PON 105. The OLT 120 serves multiple wavelengths through one fiber 110 to the multiplexer 160 at the RN 170, which multiplexes/demultiplexes signals between the OLT 120 and a plurality of ONUs 140, 140a-n. Multiplexing combines several input signals and outputs a combined signal. Time wavelength division multiplexing (TWDM) uses both time and wavelength dimensions to multiplex signals.

For WDM, the OLT 120 includes multiple optical transceivers 122, 122a-n. Each optical transceiver 122 transmits signals at one fixed wavelength $\lambda_D$ (referred to as a downstream wavelength) and receives optical signals 102 at one fixed wavelength $\lambda_U$ (referred to as an upstream wavelength). The downstream and upstream wavelengths $\lambda_D$, $\lambda_U$ may be the same or different. Moreover, a channel C may define a pair of downstream and upstream wavelengths $\lambda_D$, $\lambda_U$, and each optical transceiver 122, 122-n of a corresponding OLT 120 may be assigned a unique channel $C_{a-n}$.

The OLT 120 multiplexes/demultiplexes the channels C, $C_{a-n}$ of its optical transceivers 122, 122a-n for communication of an optical signal 102 through the feeder fiber 110. Whereas, the multiplexer 160 at the RN 170 multiplexes/demultiplexes optical signals 102, 104, 104-n between the OLT 120 and a plurality of ONUs 140, 140a-n. For example, for downstream communications, the multiplexer 160 demultiplexes the optical signal 102 from the OLT 120 into ONU optical signals 104, 104a-n, i.e., downstream optical signals 104d, for each corresponding ONU 140, 140a-n. For upstream communications, the multiplexer 160 multiplexes ONU optical signals 104, 104a-n from each corresponding ONU 140, 140a-n, i.e., upstream optical signals 104u, into the optical signal 102 for delivery to the OLT 120. To make the transmission successful, the optical transceivers 122, 122a-n of the OLT 120 match with the ONUs 140, 140a-n one-by-one. In other words, the downstream and upstream wavelengths $\lambda_D$, $\lambda_U$ (i.e., the channel C) of respective downstream and upstream optical signals 104d, 104u to and from a given ONU 140 matches the downstream and upstream wavelengths $\lambda_D$, $\lambda_U$ (i.e., the channel C) of a corresponding optical transceiver 122.

Figure 3:
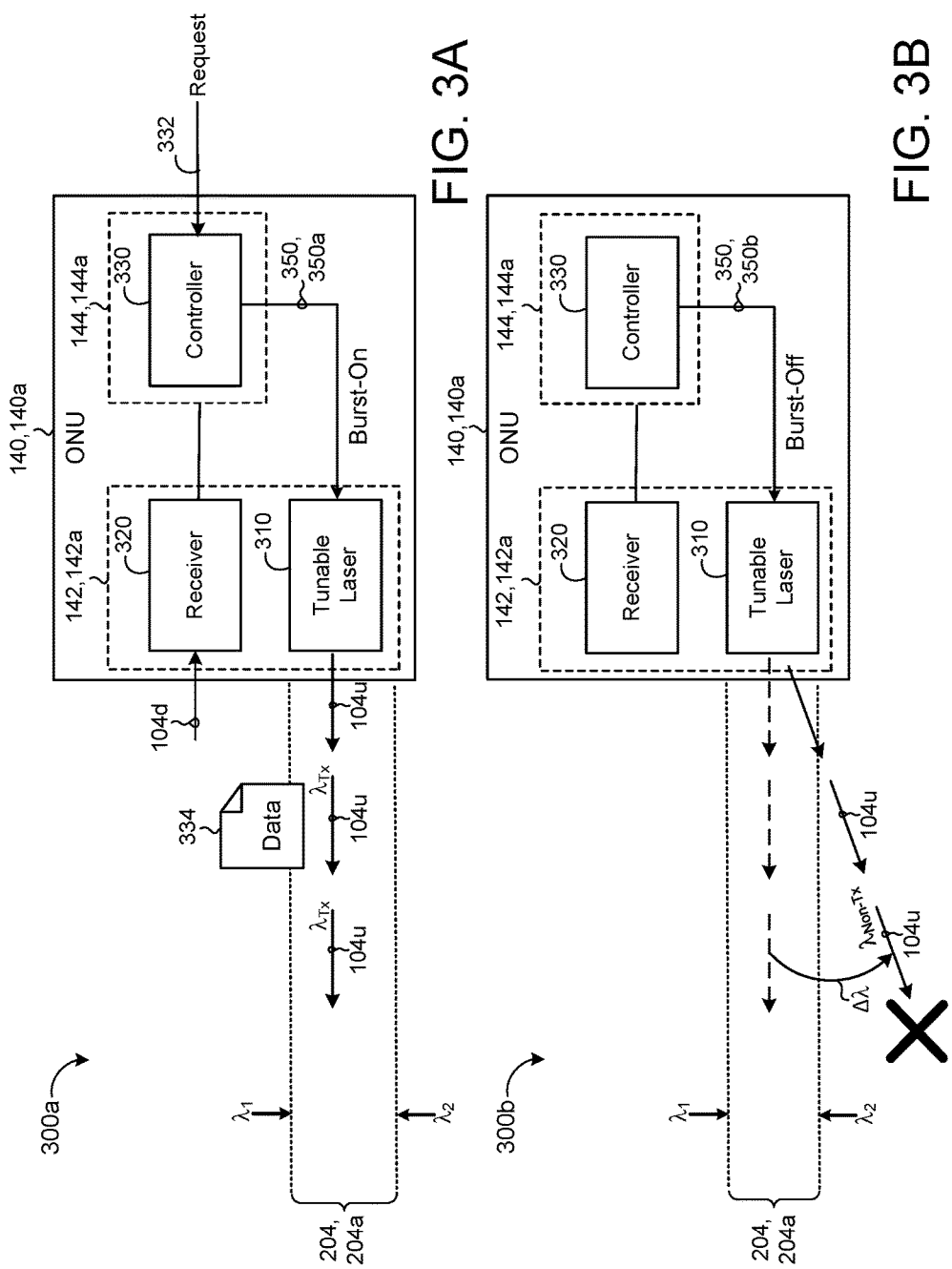
FIGS. 3A and 3B are schematic views of an optical network unit configured to continuously transmit an optical signal in a burst-on state and a burst-off state.

In some implementations, each ONU 140, 140a-n includes a corresponding tunable ONU transceiver 142, 142a-n (e.g., that includes a laser or light emitting diode) that can tune to any wavelength $\lambda$ used by a corresponding OLT 120 at a receiving end. The ONU 140 may automatically tune the tunable ONU transceiver 142 to a wavelength $\lambda$ that establishes a communication link between the corresponding OLT 120 and the ONU 140. Each optical transceiver 122, 142 may include data processing hardware 124, 144 (e.g., circuitry, field programmable gate arrays (FPGAs, etc.) and memory hardware 126, 146 in communication with the data processing hardware 124, 144. The memory hardware 126, 146 may store instructions (e.g., via firmware) that when executed on the data processing hardware 124, 144 cause the data processing hardware 124, 144 to perform operations for auto-tuning the optical transceiver 122, 142. In some configurations, the tunable ONU transceiver 142 includes a tunable laser 310 configured to continuously transmit an optical signal 104u to the multiplexer 160, 180 in a burst-on state (FIG. 3A) and a burst-off state (FIG. 3B). The ONU 140 may include a photodetector that converts the optical wave to an electric form. The electrical signal may be further de-multiplexed down to subcomponents (e.g., data over a network, sound waves converted into currents using microphones and back to its original physical form using speakers, converting images converted into currents using video cameras and converting back to its physical form using a television). Additional details on auto-tuning the ONU 140 to communicate with the corresponding OLT 120 can be found in U.S. patent application Ser. No. 15/354,811, filed on Nov. 17, 2016, which is hereby incorporated by reference in its entirety.

Figure 2:
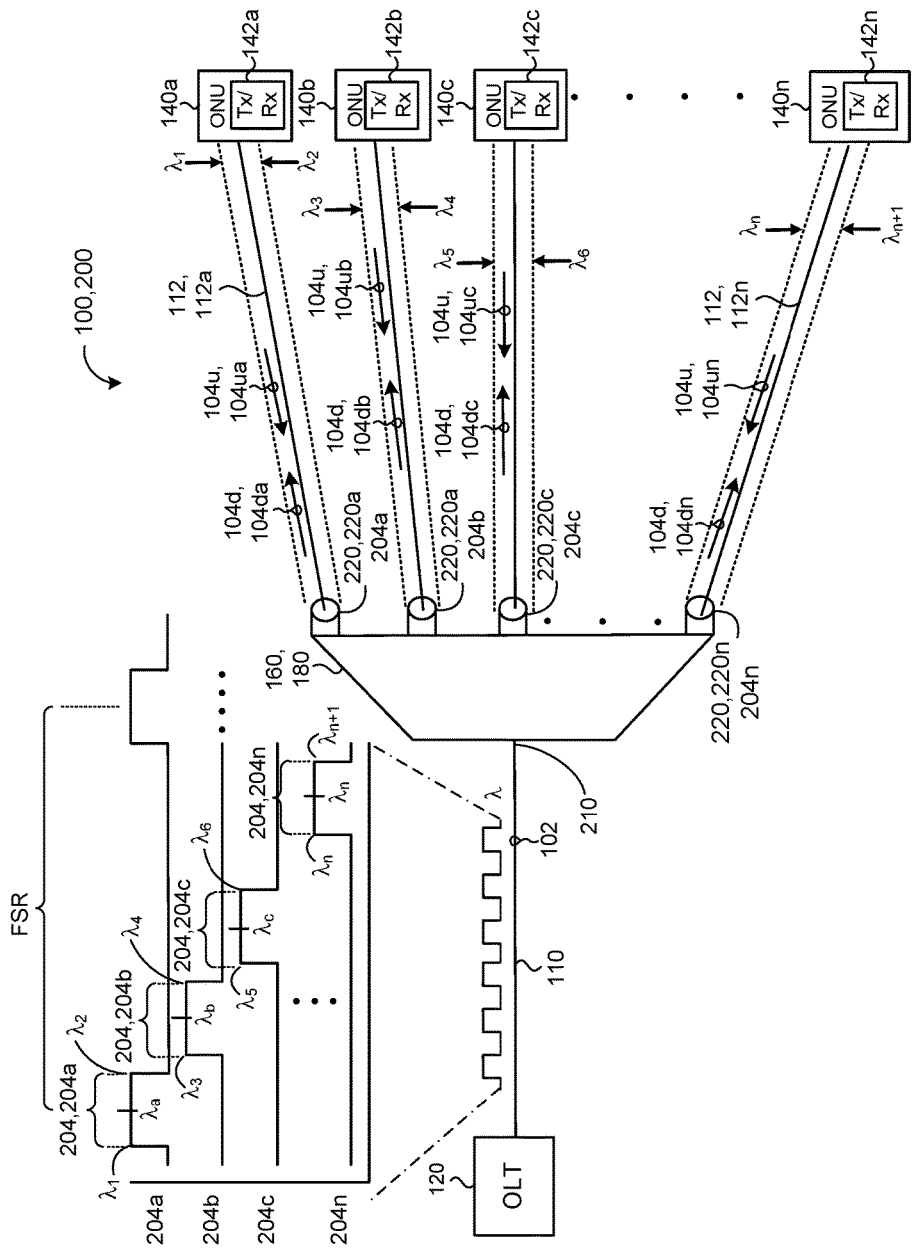
FIG. 2 is a schematic view of an example time-wavelength division multiplexing architecture for a communication system that facilitates user aggregation onto a single strand of fiber.

FIG. 2 illustrates an example TWDM or WDM architecture 200 for the communication system 100 that facilitates user aggregation onto a single strand of fiber 110, 112, 112a-n. An exemplary arrayed waveguide grating 180 (AWG), which may be used as a multiplexer 160, is optically coupled to the OLT 120 and a plurality of ONUs 140, 140a-n. The AWG 180 may be used to demultiplex an optical signal 102 through the feeder fiber 110 from the OLT 120 into downstream ONU optical signals 104d, 104da-104dn of several different wavelengths $\lambda$ for each corresponding ONU 140, 140a-n. The AWG 180 may reciprocally multiplex upstream ONU optical signals 104u, 104ua-104un of different wavelengths $\lambda$ from each ONU 140 into a single optical feeder fiber 110, whereby the OLT 120 receives the multiplexed optical signal 104 through the feeder fiber 110. The AWG 180 includes a multiplex port 210 optically coupled to the OLT 120 and a plurality of demultiplex ports 220, 220a-n. Each demultiplex port 220 is optically coupled to a corresponding ONU 140 of the plurality of ONUs 140, 140a-n. In some examples, the AWG 180 is disposed at the RN 170. In other examples, the AWG 180 is disposed at the OLT 120, or more specifically, co-located with the OLT 120 at the CO 130.

Each demultiplex port 220 is optically coupled to the multiplex port 210 of the AWG 160, 180 with a unique wavelength response. Each demultiplex port 220 has one or more pass-bands X. The pass-bands of adjacent demultiplex ports 220 are separated in wavelength $\lambda$ by wavelength spacing Y. In the example shown, the wavelength spacing Y is about 100 Gigahertz (GHz) with a wavelength pass-band 204 of about 40 GHz. For instance, first, second, and third wavelengths $\lambda_a$, $\lambda_b$, $\lambda_c$ are each separated by 100 GHz and associated with a corresponding wavelength pass-band 204, 204a-c of about 40 GHz. However, in other configurations, the wavelength pass-band 204 may be greater than, less than or equal to 40 GHz, and the wavelength spacing may be greater, less than or equal to 100 GHz. The wavelength pass-band 204a associated with wavelength $\lambda_a$ is defined by lower and upper wavelength limits $\lambda_1$, $\lambda_2$, the wavelength pass-band 204b associated with wavelength $\lambda_b$ is defined by upper and lower wavelength limits $\lambda_3$, $\lambda_4$, and the wavelength pass-band 204c associated with wavelength $\lambda_c$ is defined by upper and lower wavelength limits $\lambda_5$, $\lambda_6$. The wavelength pass-bands 204 may be separated by a range of wavelengths associated with a stop-band. In the example shown, a stop-band is defined between the upper wavelength limit $\lambda_2$ of the wavelength pass-band 204a and the lower wavelength limit $\lambda_3$ of the wavelength pass-band 204b, and another stop-band is defined between the upper wavelength limit $\lambda_4$ of the wavelength pass-band 204b and the lower wavelength limit $\lambda_5$ of the wavelength pass-band 204c.

The AWG 180 may be cyclic in nature. In a cyclic AWG, the wavelength multiplexing and demultiplexing property of the AWG 180 repeats over periods of wavelengths called free spectral range (FSR). Multiple wavelengths, separated by the FSR, are passed through the AWG 180 from each demultiplex port 220 to the multiplex port 210. This means that the demultiplex port that passes $\lambda_a$ will also pass $\lambda_a$+FSR. Using a cyclic AWG 180 as a multiplexer allows the use of two wavelengths $\lambda$ for each channel C, one wavelength $\lambda_U$ for upstream and one wavelength $\lambda_D$ for downstream.

In some implementations, each demultiplex port 220, 220a-n of the AWG 180 is associated with a corresponding one of the wavelength pass-bands 204, 204a-n. Here, the AWG 180 is configured to allow passage therethrough of each upstream optical signal 104u having a wavelength within the wavelength pass-band 204 associated with the corresponding demultiplex port 220. However, for any upstream optical signals 104u having a wavelength outside the wavelength pass-band 204 associated with the corresponding demultiplex port 220, the AWG 180 is configured to block the passage therethrough of those upstream optical signals 104u. In the example shown, the ONU transceiver 142a of the ONU 140a transmits a corresponding optical signal 104ua at a wavelength within the wavelength pass-band 204a of the corresponding demultiplex port 220a. For instance, the wavelength of the optical signal 104ua is greater than the lower wavelength limit $\lambda_1$ and less than the upper wavelength limit $\lambda_2$ of the wavelength pass-band 204a. Similarly, each ONU transceiver 142b-n of the ONUs 140b-n transmits a corresponding optical signal 104ub-104un at a corresponding wavelength within the wavelength pass-band 204b-n associated with the corresponding demultiplex port 220b-n.

Generally, to avoid crosstalk at the OLT 120, only one ONU 140 transmits upstream optical signals 104u to the OLT 120 at a time. The ONU transceivers 142 include a transmitter 310 (FIGS. 3A and 3B), usually a semiconductor laser, configured to transmit upstream optical signals 104u to the OLT 120 in a burst-on state. Turning off the laser 310 to cease transmission of the optical signals 104u to the OLT 120 when not in use causes the temperature of the laser 310 to cool. The laser 310 is once again heated when turned on to transmit a subsequent upstream optical signal 104u. Heating of the laser 310 increases the refractive index of a laser cavity of the laser 310, which causes the transmitter 310 to continuously increase in wavelength $\lambda$ for a short period of time at the start of the transmission burst. In some examples, the wavelength of the optical signals 104u drift out of the wavelength pass-band 204 associated with the multiplexer 160, 180, thereby resulting in the multiplexer 160, 180 blocking the passage therethrough of the optical signals 104u to the OLT 120.

In a TDM system, the percentage of time each ONU 140 is transmitting signal in the burst-on state is called the duty cycle. The duty cycle of each ONU 140 is determined by the upstream traffic generated by each respective user and by the average upstream traffic with that TDM system, for example, a TDM PON system. The temperature of the laser cavity may be related to the duty cycle, which means changes in the duty cycle results in changes to the transmitter wavelength, thereby resulting in the multiplexer 160, 180 blocking passage therethrough of the optical signals 104u to the OLT 120 for some given duty cycles, while allowing passage therethrough of the optical signals 104u to the OLT 120 for some other duty cycles.

Referring to FIGS. 3A and 3B, in some implementations, the ONU transceiver 142, 142a of the ONU 140, 140a of the communication system 100 includes a tunable laser 310 configured to continuously transmit an optical signal 104u to the multiplexer 160 in a burst-on state (FIG. 3A) and a burst-off state (FIG. 3B). While in the burst-on state, the tunable laser 310 transmits the optical signal 104u at a transmit wavelength $\lambda_{Tx}$ inside the pass-band 204 of the multiplexer 160. The multiplexer 160 allows the optical signal 104u at the transmit wavelength $\lambda_{Tx}$ to pass therethrough and along the feeder fiber 110 for receipt by the OLT 120. Rather than un-powering the laser 310 entirely to cease transmission of the optical signal 104u to the OLT 120, and thereby cause cooling of the tunable laser 310, the tunable laser 310 is configured to shift the wavelength of the optical signal 104u from the transmit wavelength $\lambda_{Tx}$ to a non-transmit wavelength $\lambda_{Non-Tx}$ outside the pass-band 204 of the multiplexer 160 in the burst-off state. Here, the multiplexer 160 blocks the optical signal 104u at the non-transmit wavelength $\lambda_{Non-Tx}$ from passing therethrough, thereby blocking the OLT 120 from receiving the optical signal 104u. By continuing to transmit the optical signal 104u to the multiplexer 160 in the burst-off state, avoids large thermal fluctuations that would otherwise occur if the tunable laser 310 were turned off/on. By transmitting at a wavelength $\lambda$ in the stop-band, the multiplexer 160 will prevent the OLT 120 from receiving optical signals 104u from the ONU 140. Accordingly, the transmission of optical signals 104u in the burst-off state decreases thermal fluctuations at the laser 310, and thereby substantially inhibits large wavelength drifts from occurring when the ONU 140 is commanded to subsequently transmit a data packet 334 (FIG. 3A) in the optical signal 104u for receipt by the OLT 120.

The multiplexer 160 may include the AWG 180 having the corresponding demultiplex port 220, 220a associated with the wavelength pass-band 204, 204a defined by the upper and lower wavelength limits $\lambda_1$, $\lambda_2$. The ONU transceiver 142 also includes a receiver 320 configured to receive downstream optical signals 104d from the OLT 120 that have been demultiplexed by the multiplexer 160. The data processing hardware 144, 144a of the ONU 140 may implement a controller 330 that electrically couples to the tunable laser 310 and triggers the burst-on and burst-off states of the tunable laser 310. For instance, the controller 330 may trigger the burst-on state by transmitting a burst-on current 350, 350a to the tunable laser 310 and may trigger the burst-off state by transmitting a burst-off current 350, 350b to the tunable laser 310. In some configurations, the tunable laser 310 includes a distributed Bragg reflector (DBR) laser configured to receive a wavelength tuning injection current 350, 350a-b for biasing the wavelength of optical signal 104u transmitted from the DBR laser 310.

Referring to FIG. 3A, the schematic view 300a shows the ONU 140 tuning the tunable laser 310 while in the burst-on state to transmit the optical signal 104u at the transmit wavelength $\lambda_{Tx}$ within the wavelength pass-band 204, 204a of the multiplexer 160 (e.g., AWG 180). The multiplexer 160 is configured to allow passage therethrough of the optical signal 104u at the transmit wavelength $\lambda_{Tx}$.

In some examples, the controller 330 receives a request 332 to transmit the data packet 334 on the optical signal 104u and triggers the burst-on state of the tunable laser 310 by transmitting the burst-on current 350a to the tunable laser 310. The burst-on current 350a may bias the tunable laser 310 to transmit the optical signal 104u at the transmit wavelength $\lambda_{Tx}$ within the wavelength pass-band 204 of the multiplexer 160. The controller 330 may then instruct the tunable laser 310 to transmit the data packet 334 on the optical signal 104u while the tunable laser 310 is in the burst-on state.

Referring to FIG. 3B, the schematic view 300b shows the ONU 140 tuning the tunable laser 310 in the burst-off state to transmit the optical signal 104u at the non-transmit wavelength $\lambda_{Non-Tx}$ outside the wavelength pass-band 204, 204a of the multiplexer 160 (e.g., AWG 180). The multiplexer 160 is configured to block passage therethrough of the optical signal 104u at the non-transmit wavelength $\lambda_{Non-Tx}$.

In some implementations, the controller 330 enables the burst-off state of the tunable laser 310 by transmitting the burst-off current 350b to the tunable laser 310. For instance, after transmission of the data packet 334 while in the burst-on state, the controller 330 may trigger the burst-off state of the tunable laser 310 by transmitting the burst-off current 350b. The burst-off current 350b is configured to bias the tunable laser 310 to transmit the optical signal 104u at the non-transmit wavelength $\lambda_{Non-Tx}$ outside of the wavelength pass-band 204 of the multiplexer 160.

Accordingly, the controller 330 alters the wavelength of the optical signal 104u between the transmit wavelength $\lambda_{Tx}$ and the non-transmit wavelength $\lambda_{Non-Tx}$ by altering the wavelength tuning injection current 350 to the tunable laser 310 between the burst-on current 350a and the burst-off current 350b. For instance, injecting the burst-off current 350b to the tunable laser 310 causes the tunable laser 310 to sweep the wavelength of the optical signal 104u from the transmit wavelength $\lambda_{Tx}$ to the non-transmit wavelength $\lambda_{Non-Tx}$ outside the pass-band 204 of the multiplexer 160. FIG. 3B shows the change in wavelength $\Delta\lambda$ between the transmit wavelength $\lambda_{Tx}$ inside the wavelength pass-band 204 of the multiplexer 160 and the non-transmit wavelength $\lambda_{Non-Tx}$ outside the wavelength pass-band 204 of the multiplexer 160. In some examples, the change in wavelength $\Delta\lambda$ is equal to about 200 GHz so that the multiplexer 160 including the AWG 180 provides greater than 30 decibels (dB) of isolation to effectively suppress the optical signal 104u while the tunable laser 310 is in the burst-off state.

In response to receiving another request 332 to transmit a data packet 334 on the optical signal 104u, the controller 330 may trigger the burst-on state of the tunable laser 310 by transmitting the burst-on current 350a to the tunable laser 310. In some examples, the controller 330 alters the wavelength tuning injection current 350 to the tunable laser 310 from the burst-off current 350b to the burst-on current 350a by no more than about 25 milliamperes (mA). In this example, the altering of the wavelength tuning injection current 350 may result in less than about 10 GHz wavelength drift during a 125 microsecond (μs) transmission of the data packet 334 on the optical signal 104u. Thus, when the pass-band 204 of the multiplexer 160 is equal to 40 GHz, an ONU upstream signal 104u with a small wavelength shift of 10 GHz wavelength will be allowed to pass through the multiplexer 160 for receipt by the OLT 120.

The more typical action during an off-burst period (i.e., the burst-off state of the tunable laser 310) is to reduce the bias of the gain section injection current, effectively turning the laser off. In some cases, this can cause the laser 310 to drift by more than 20 GHz when the gain section injection current is again increased to enable transmission during an on-burst period (i.e., the burst-on state of the tunable laser 310).

Figure 4:
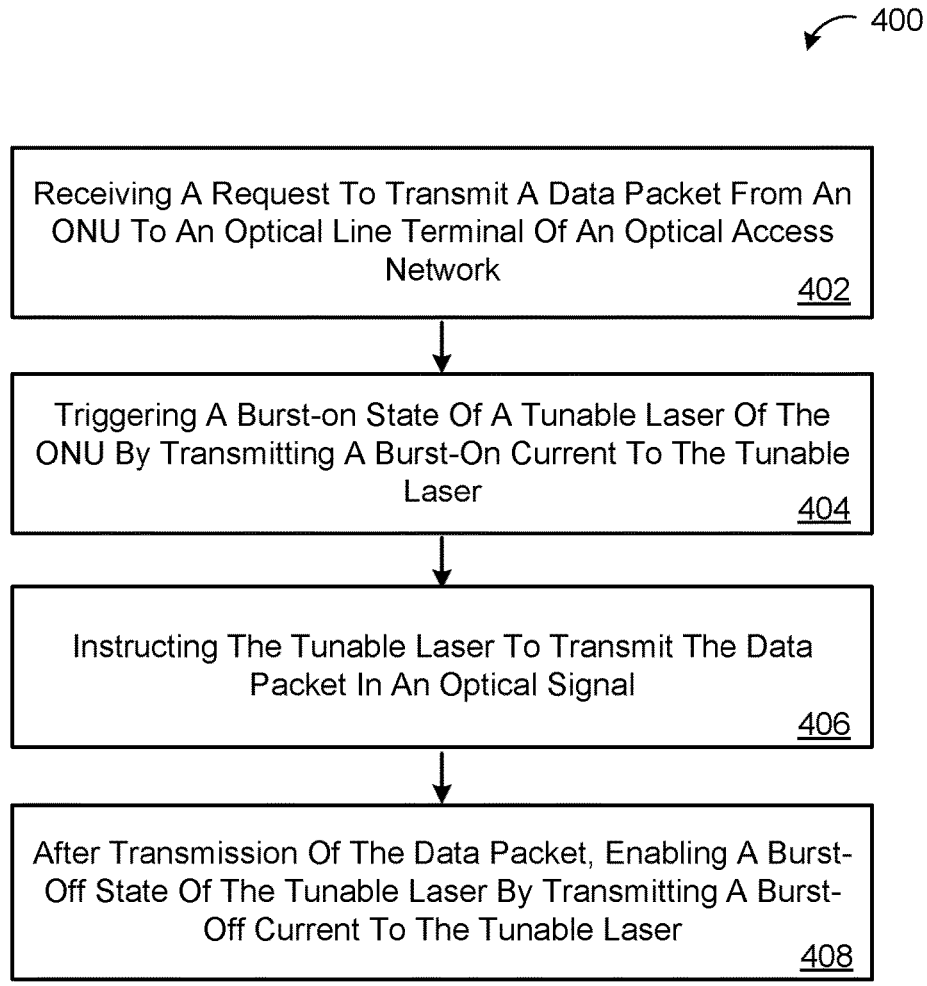
FIG. 4 is a schematic view of an example arrangement of operations for a method of enabling a burst-off state of a tunable laser.

FIG. 4 provides an example arrangement of operations for a method 400 of enabling a burst-off state of a tunable laser 310. At block 402, the method 400 includes receiving, at data processing hardware 144, a request 332 to transmit a data packet 334 from an optical network unit (ONU) 140 to an optical line terminal (OLT) 120 of an optical access network 105 having a multiplexer 160 optically coupled between the ONU 140 and the OLT 120. The multiplexer 160 has a wavelength pass-band 204 and the ONU 140 includes the tunable laser 310 configured to continuously transmit an optical signal 104u in either a burst-on state or the burst-off state.

At block 404, the method 400 includes triggering, by the data processing hardware 144, the burst-on state of the tunable laser 310 by transmitting a burst-on current 350a to the tunable laser 310. The burst-on current 350a biases the tunable laser 310 to transmit the optical signal 104u at a transmit wavelength $\lambda_{Tx}$ within the wavelength pass-band 204 of the multiplexer 160. The multiplexer 160 is configured to allow passage therethrough of the optical signal 104u at the transmit wavelength $\lambda_{Tx}$. At block 406, the method 400 includes instructing, by the data processing hardware 144, the tunable laser 310 to transmit the data packet 334 in the optical signal 104u. Accordingly, the OLT 120 may receive the optical signal 104u transmission at the transmit wavelength $\lambda_{Tx}$.

At block 408, the method 400 includes enabling, by the data processing hardware 144, the burst-off state of the tunable laser 310 after transmission of the data packet 334. The data processing hardware 144 may enable the burst-off state by transmitting a burst-off current 350b to the tunable laser that biases the tunable laser 310 to transmit the optical signal 104u at a non-transmit wavelength $\lambda_{Non-Tx}$ outside of the wavelength pass-band 204 of the multiplexer 160. The multiplexer 160 is configured to block passage therethrough of the optical signal 104u at the non-transmit wavelength $\lambda_{Non-Tx}$.

In some implementation, the tunable laser 310 includes a distributed Bragg reflector (DBR) laser 310. Additionally or alternatively, the multiplexer 160 may include an arrayed wavelength grating (AWG) 180. The AWG 180 may be optically coupled to a plurality of ONUs 140, 140a-n. For instance, the AWG 180 may include a multiplex port 210 optically coupled to the OLT 120 and a plurality of demultiplex ports 220, 220a-n. Each demultiplex port 220 may be associated with a corresponding wavelength pass-band 204, 204a-n and optically coupled to a corresponding ONU 140 of the plurality of ONUs 140, 140a-n. In some examples, the AWG 180 is co-located at a central office (CO) 130 with the OLT 120. In other examples, the AWG 180 is disposed at a remote node (RN) 170 optically coupled between the ONU 140 and the OLT 120.

Figure 5:
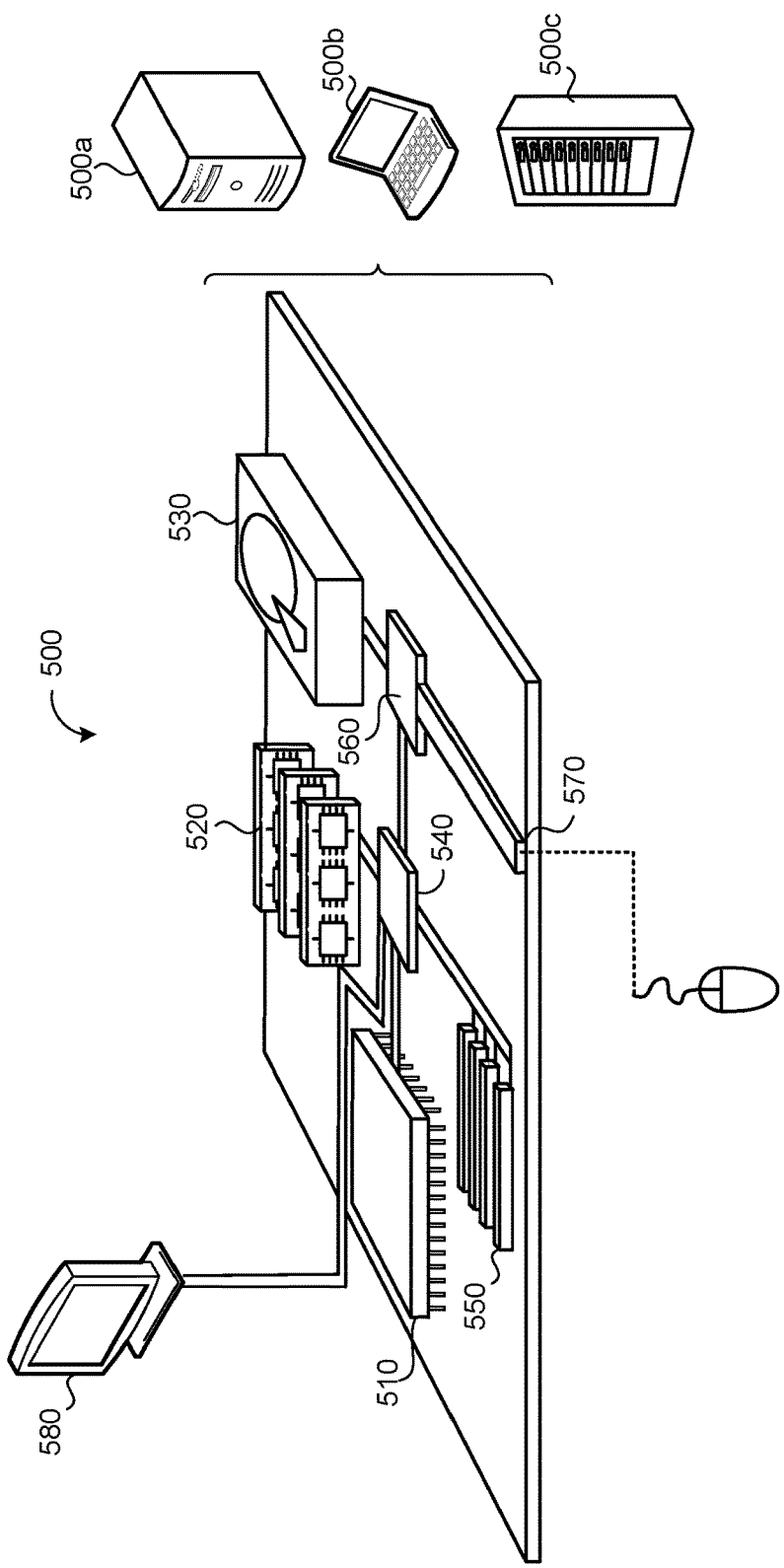
FIG. 5 is schematic view of an example computing device that may be used to implement the systems and methods described in this document.

FIG. 5 is a schematic view of an example computing device 500 that may be used to implement the systems and methods described in this document. The computing device 500 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 500 includes a processor 510, memory 520, a storage device 530, a high-speed interface/controller 540 connecting to the memory 520 and high-speed expansion ports 550, and a low speed interface/controller 560 connecting to low speed bus 570 and storage device 530. Each of the components 510, 520, 530, 540, 550, and 560, are interconnected using various busses, and may be mounted on a common motherboard or in other manners as appropriate. The processor 510 can process instructions for execution within the computing device 500, including instructions stored in the memory 520 or on the storage device 530 to display graphical information for a graphical user interface (GUI) on an external input/output device, such as display 580 coupled to high speed interface 540. In other implementations, multiple processors and/or multiple buses may be used, as appropriate, along with multiple memories and types of memory. Also, multiple computing devices 500 may be connected, with each device providing portions of the necessary operations (e.g., as a server bank, a group of blade servers, or a multi-processor system).

The memory 520 stores information non-transitorily within the computing device 500. The memory 520 may be a computer-readable medium, a volatile memory unit(s), or non-volatile memory unit(s). The non-transitory memory 520 may be physical devices used to store programs (e.g., sequences of instructions) or data (e.g., program state information) on a temporary or permanent basis for use by the computing device 500. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 530 is capable of providing mass storage for the computing device 500. In some implementations, the storage device 530 is a computer-readable medium. In various different implementations, the storage device 530 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 520, the storage device 530, or memory on processor 510.

The high speed controller 540 manages bandwidth-intensive operations for the computing device 500, while the low speed controller 560 manages lower bandwidth-intensive operations. Such allocation of duties is exemplary only. In some implementations, the high-speed controller 540 is coupled to the memory 520, the display 580 (e.g., through a graphics processor or accelerator), and to the high-speed expansion ports 550, which may accept various expansion cards (not shown). In some implementations, the low-speed controller 560 is coupled to the storage device 530 and low-speed expansion port 570. The low-speed expansion port 570, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 500a or multiple times in a group of such servers 500a, as a laptop computer 500b, or as part of a rack server system 500c.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A system comprising:
   a multiplexer having a wavelength pass-band; and
   an optical network unit (ONU) optically coupled to the multiplexer, the ONU comprising a tunable laser configured to continuously transmit an optical signal to the multiplexer alternating between a burst-on state and a burst-off state, the ONU configured to perform operations comprising:
  while in the burst-on state, tuning the tunable laser to transmit the optical signal at a transmit wavelength within the wavelength pass-band of the multiplexer, the multiplexer configured to allow passage therethrough of the optical signal at the transmit wavelength; and
  while in the burst-off state, tuning the tunable laser to transmit the optical signal at a non-transmit wavelength outside of the wavelength pass-band of the multiplexer, the multiplexer configured to block passage therethrough of the optical signal at the non-transmit wavelength.

2. The system of claim 1, wherein the tunable laser comprises a distributed Bragg reflector (DBR) laser configured to receive an wavelength tuning injection current, the wavelength tuning injection current biasing the wavelength of the optical signal.

3. The system of claim 2, wherein the operations further comprise altering the wavelength of the optical signal between the transmit wavelength and the non-transmit wavelength by altering the wavelength tuning injection current to the tunable laser.

4. The system of claim 1, wherein the operations further comprise:
  receiving a request to transmit a data packet on the optical signal;
  triggering the burst-on state;
  transmitting the data packet on the optical signal while in the burst-on state; and
  triggering the burst-off state.

5. The system of claim 1, wherein the multiplexer comprises an arrayed wavelength grating.

6. The system of claim 5, further comprising an optical line terminal (OLT) optically coupled to the arrayed wavelength grating.

7. The system of claim 6, further comprising:
  a plurality of ONUs optically coupled to the arrayed wavelength grating,
  wherein the arrayed wavelength grating has a multiplex port optically coupled to the OLT and a plurality of demultiplex ports, each demultiplex port associated with a corresponding wavelength pass-band and optically coupled to a corresponding ONU of the plurality of ONUs.

8. The system of claim 7, wherein the arrayed wavelength grating is disposed at the OLT.

9. The system of claim 1, wherein the multiplexer is disposed at a remote node optically coupled to the ONU.

10. A system comprising:
  a multiplexer having a wavelength pass-band;
  a tunable laser optically coupled to the multiplexer and configured to continuously transmit an optical signal to the multiplexer alternating between a burst-on state and a burst-off state; and
  a controller electrically coupled to the tunable laser, the controller configured to perform operations comprising:
    receiving a request to transmit a data packet;
    triggering the burst-on state of the tunable laser by transmitting a burst-on current to the tunable laser, the burst-on current biasing the tunable laser to transmit the optical signal at a transmit wavelength within the wavelength pass-band of the multiplexer, the multiplexer configured to allow passage therethrough of the optical signal at the transmit wavelength;
    instructing the tunable laser to transmit the data packet in the optical signal while the tunable laser is in the burst-on state; and
    triggering the burst-off state of the tunable laser by transmitting a burst-off current to the tunable laser, the burst-off current biasing the tunable laser to transmit the optical signal at a non-transmit wavelength outside of the wavelength pass-band of the multiplexer, the multiplexer configured to block passage therethrough of the optical signal at the non-transmit wavelength.

11. The system of claim 10, wherein the tunable laser comprises a distributed Bragg reflector (DBR) laser.

12. The system of claim 10, wherein the multiplexer comprises an arrayed wavelength grating.

13. The system of claim 12, further comprising an optical line terminal (OLT) optically coupled to the arrayed wavelength grating.

14. The system of claim 13, wherein the arrayed wavelength grating is disposed at the OLT.

15. The system of claim 10, wherein the multiplexer is disposed at a remote node optically coupled to the tunable laser.

16. A method comprising:
  receiving, at data processing hardware, a request to transmit a data packet from an optical network unit (ONU) to an optical line terminal (OLT) of an optical access network having a multiplexer optically coupled between the ONU and the OLT, the multiplexer having a wavelength pass-band, the ONU comprising a tunable laser configured to continuously transmit an optical signal that alternates between a burst-on state and a burst-off state;
  triggering, by the data processing hardware, the burst-on state of the tunable laser by transmitting a burst-on current to the tunable laser, the burst-on current biasing the tunable laser to transmit the optical signal at a transmit wavelength within the wavelength pass-band of the multiplexer, the multiplexer configured to allow passage therethrough of the optical signal at the transmit wavelength;
  instructing, by the data processing hardware, the tunable laser to transmit the data packet in the optical signal; and
  after transmission of the data packet, enabling, by the data processing hardware, the burst-off state of the tunable laser by transmitting a burst-off current to the tunable laser, the burst-off current biasing the tunable laser to transmit the optical signal at a non-transmit wavelength outside of the wavelength pass-band of the multiplexer, the multiplexer configured to block passage therethrough of the optical signal at the non-transmit wavelength.

17. The method of claim 16, wherein the tunable laser comprises a distributed Bragg reflector (DBR) laser.

18. The method of claim 16, wherein the multiplexer comprises an arrayed wavelength grating.

19. The method of claim 18, wherein the arrayed wavelength grating is disposed at the OLT.

20. The system of claim 16, wherein the multiplexer is disposed at a remote node optically coupled between the ONU and the OLT.

* * * * *